United States Patent
Ikenaga et al.

(10) Patent No.: US 7,947,598 B2
(45) Date of Patent: May 24, 2011

(54) SUBSTRATE FOR SEMICONDUCTOR DEVICE, RESIN-SEALED SEMICONDUCTOR DEVICE, METHOD FOR MANUFACTURING SAID SUBSTRATE FOR SEMICONDUCTOR DEVICE AND METHOD FOR MANUFACTURING SAID RESIN-SEALED SEMICONDUCTOR DEVICE

(75) Inventors: Chikao Ikenaga, Kitamoto (JP); Shozo Ishikawa, Fujimino (JP)

(73) Assignee: Dai Nippon Printing Co., Ltd., Toyota (JP)

(*) Notice: Subject to any disclaimer, the term of this patent is extended or adjusted under 35 U.S.C. 154(b) by 0 days.

(21) Appl. No.: 12/923,569

(22) Filed: Sep. 28, 2010

(65) Prior Publication Data

US 2011/0014752 A1    Jan. 20, 2011

Related U.S. Application Data

(62) Division of application No. 12/314,372, filed on Dec. 9, 2008, now Pat. No. 7,825,514.

(30) Foreign Application Priority Data

Dec. 11, 2007 (JP) .................................. 2007-319685

(51) Int. Cl.
  *H01L 21/44* (2006.01)
  *H01L 23/48* (2006.01)
(52) U.S. Cl. ........................ 438/652; 257/750
(58) Field of Classification Search .................. 257/736, 257/748, 750, 781; 438/614, 652
See application file for complete search history.

(56) References Cited

U.S. PATENT DOCUMENTS

| 7,825,514 B2 * | 11/2010 | Ikenaga et al. ............. 257/750 |
| 2007/0138619 A1 * | 6/2007 | Shinagawa et al. ......... 257/700 |
| 2009/0135575 A1 | 5/2009 | Kajiki et al. |

FOREIGN PATENT DOCUMENTS

| JP | A-59-208756 | 11/1984 |
| JP | A-2002-16181 | 1/2002 |
| JP | A-2002-289739 | 10/2002 |

* cited by examiner

*Primary Examiner* — Calvin Lee
*(74) Attorney, Agent, or Firm* — Oliff & Berridge, PLC

(57) ABSTRACT

A substrate for a semiconductor device includes: a base plate, a plurality of external terminal portions respectively arranged in a plane on the base plate and having external terminal faces respectively facing the base plate; a plurality of internal terminal portions, respectively arranged in the plane on the base plate and having internal terminal faces respectively facing an opposite side to the base plate. The internal terminal portions are connected with the external terminal portions via wiring portions, respectively. A part of the external terminal portions are located on the base plate in a predetermined arrangement area in which a semiconductor element is arranged.

5 Claims, 7 Drawing Sheets

(a)

(b)

SUBSTRATE FOR SEMICONDUCTOR DEVICE, RESIN-SEALED SEMICONDUCTOR DEVICE, METHOD FOR MANUFACTURING SAID SUBSTRATE FOR SEMICONDUCTOR DEVICE AND METHOD FOR MANUFACTURING SAID RESIN-SEALED SEMICONDUCTOR DEVICE

CROSS REFERENCE TO RELATED APPLICATIONS

This is a Divisional of application Ser. No. 12/314,372 filed Dec. 9, 2008, which claims priority of Japanese Patent Application No. 2007-319685 filed on Dec. 11, 2007. The entire disclosures of the prior applications are hereby incorporated by reference herein in their entirety.

BACKGROUND OF THE INVENTION

1. Field of the Invention

The present invention relates to a resin-sealed semiconductor device downsized in a planar direction and a method for manufacturing the resin-sealed semiconductor device. Additionally, this invention relates to a substrate used for forming the resin-sealed semiconductor device and a method for manufacturing the substrate.

2. Background Art

A conventional resin-sealed semiconductor device includes, as shown in FIG. 7(d), a plurality of terminal portions 70, each having an internal terminal face 70a and an external terminal face 70b respectively formed on front and rear faces thereof, a semiconductor element 50 located on a die pad 75, wires 30, each connecting the internal terminal face 70a of each terminal portion 70 with the semiconductor element 50, and a resin sealing portion 40 made of a resin material for sealing the terminal portions 70, die pad 75, semiconductor element 50 and wires 30, such that a part of the external terminal face 70b of each terminal portion 70 can be exposed to the outside (see JP1984-208756A (TOKUKAI-SHO No. 59-208756), JP2002-289739A and JP2002-16181A).

In addition, a projection (or projections) 70t is provided to the periphery of the internal terminal face 70a (or top face) of each terminal portion 70, in order to prevent unwanted peeling between the resin sealing portion 40 and the terminal portions 70, occurrence of cracks in the terminal portions 70 and the like, due to force exerted on these portions when a base plate 1 is peeled off from the semiconductor device, as will be described later (see FIGS. 7(a) through 7(d)). Furthermore, as shown in FIGS. 7(a) through 7(d), a projection (or projections) 75t is also provided to the periphery of a top face of the die pad 75 (see JP2002-289739A).

The resin-sealed semiconductor device of this type is manufactured in the following manner. First, the base plate 1 is prepared (see FIG. 7(a)). Then, a front face of the base plate 1 is plated, so as to form the plurality of terminal portions 70, each having the internal terminal face 70a and external terminal face 70b respectively provided on the front and rear faces thereof, together with the die pad 75 (see FIG. 7(a)). Simultaneously, the projection 70t is formed around the periphery of the internal terminal face 70a of each terminal portion 70, while the projection 75t is formed around the periphery of the top face of the die pad 75.

Thereafter, the semiconductor element 50 is mounted on the die pad 75, and is then electrically connected with the internal terminal face 70a of each terminal portion via the wire 30 (see FIG. 7(b)). Subsequently, the terminal portions 70, die pad 75, semiconductor element 50 and wires 30 are sealed with the resin sealing portion 40 made of the resin material (see FIG. 7(c)). Finally, the base plate 1 is removed from the semiconductor device, so as to expose the external terminal face 70b of each terminal portion 70 to the outside (see FIG. 7(d)).

Because such a finally obtained resin-sealed semiconductor device has no base plate 1, the thickness of the semiconductor device can be substantially reduced. However, since each terminal portion 70 has the internal terminal face 70a and external terminal face 70b respectively provided on the front and rear faces thereof, such a terminal portion 70 should be arranged outside the periphery of the die pad 75. Thus, only the device of the so-called Fan-Out type can be manufactured. Accordingly, there is still a need for sufficiently or significantly downsizing the resin-sealed semiconductor device in the planar direction (or any suitable direction vertical to the thickness direction of the device).

SUMMARY OF THE INVENTION

The present invention was made in light of the above problems, and it is therefore an object of this invention to provide a new resin-sealed semiconductor device, which is significantly downsized in the planar direction, and a method for manufacturing this resin-sealed semiconductor device. Another object of this invention is to provide a substrate used for forming the resin-sealed semiconductor device related to the present invention and a method for manufacturing this substrate.

The substrate used for the semiconductor device related to a first aspect of the present invention comprises:

a base plate made of a metal;

a plurality of external terminal portions, respectively arranged in a plane on the base plate and having external terminal faces respectively facing the base plate;

a plurality of internal terminal portions, respectively arranged in the plane on the base plate and having internal terminal faces respectively facing an opposite side to the base plate; and wiring portions, respectively connecting the internal terminal portions with the external terminal portions in the plane on the base plate, wherein at least a part of the external terminal portions are located on the base plate in a predetermined arrangement area in which a semiconductor element is arranged.

With such configuration, the part of the external terminal portions can be located on the base plate in the predetermined arrangement area in which the semiconductor element is arranged. Thus, the substrate for the semiconductor device can be significantly downsized in the planar direction.

In the substrate for the semiconductor device related to the first aspect of the present invention, it is preferred that all of the internal terminal portions are located on the base plate outside the predetermined arrangement area in which the semiconductor element is arranged.

With such configuration, overlap between the internal terminal portions and the semiconductor element arranged in the predetermined arrangement area can be prevented. As such, the internal terminal portions can be securely connected with the semiconductor element, by wire bonding, respectively.

However, in the case of connecting the internal terminal portions with the semiconductor element in a flip-chip mode, each internal terminal portion is electrically connected with the semiconductor element via a proper internal connection part (e.g., a bump). Accordingly, in such a case, it is preferred that all of the internal terminal portions are located on the base plate in the predetermined arrangement area in which the semiconductor element is arranged.

In the substrate for the semiconductor device related to the first aspect of the present invention, it is preferred that the other external terminal portions, than the part of the external terminal portions located in the predetermined arrangement area for the semiconductor element, are located on the base plate outside, in the planar direction, relative to the internal terminal portions.

With such configuration, any given number of the external terminal portions can be provided to the substrate, thereby compensating for the number of the external terminal portions that cannot be satisfied by only the external terminal portions arranged in the predetermined arrangement area in which the semiconductor element is arranged.

In the substrate for the semiconductor device related to the first aspect of the present invention, it is preferred that all of the internal terminal portions are located on the base plate in the predetermined arrangement area in which the semiconductor element is arranged.

In the substrate for the semiconductor device related to the first aspect of the present invention, it is preferred that each internal terminal portion has one end portion located on the opposite side to the base plate and formed of an internal connection plated layer, while each external terminal portion has one end portion located on the side of the base plate and formed of an external connection plated layer.

With such configuration, the internal terminal face is composed of the internal connection plated layer of each internal terminal portion, while the external terminal face is composed of the external terminal connection plated layer of each external terminal portion. Thus, the proper internal connection part, e.g., a wire for the wire bonding or bump for the flip-chip connection or mounting mode, which will be described later, can be readily connected with the internal terminal face of each internal terminal portion. Additionally, an external connection part, e.g., a solder ball for forming a ball grid array, which will be described later, can be readily connected with the external terminal face of each external terminal portion.

Alternatively, the resin-sealed semiconductor device according to the present invention comprises:

a plurality of internal terminal portions, respectively arranged in a plane and having internal terminal faces respectively facing one side;

a plurality of external terminal portions, respectively arranged in the plane and having external terminal faces respectively facing the other side;

wiring portions, respectively connecting the internal terminal portions with the external terminal portions in the plane;

a semiconductor element mounted on the one side of at least a part of the external terminal portions, via an insulating resin layer (e.g., a die attach film, an insulating die attach agent and the like);

internal connection parts, respectively connecting the semiconductor element with the internal terminal faces of the internal terminal portions; and a resin sealing portion sealing the internal terminal portions, external terminal portions, semiconductor element, internal connection parts and wiring portions, while at least the external terminal faces of the external terminal portions are exposed to the outside.

With such configuration, the semiconductor element can be mounted on the one side of the part of the external terminal portions via the insulating resin layer, thus significantly downsizing the resin-sealed semiconductor device in the planar direction.

In the resin-sealed semiconductor device according to the present invention, it is preferred that the semiconductor device further comprises: an external insulating layer located on the side of the external terminal faces of the external terminal portions on the resin sealing portion and having openings respectively corresponding to the external terminal faces; and external connection parts respectively inserted or fitted in the openings of the external insulating layer, such that the external connection parts can be connected with the external terminal faces of the external portions.

With provision of such an external insulating layer (e.g., a solder resist), only the external terminal portions can serve as external terminals, thereby preventing occurrence of unwanted phenomena, such as an inadvertent short circuit and the like. Furthermore, with the provision of the external insulating layer, the external terminal face of each external terminal portion can be electrically connected, with ease, to an external member, such as wiring of a printed-circuit board or the like, via the external connection part.

In the resin-sealed semiconductor device according to the present invention, it is preferred that all of the internal terminal portions used for the wire bonding are located outside, in the planar direction, relative to the semiconductor element. Meanwhile, it is preferred that all of the internal terminal portions used for the flip-chip connection mode are located inside, in the planar direction, relative to the semiconductor element.

With such configuration, highly reliable electrical connection between the internal terminal portions and the semiconductor element can be achieved.

In the resin-sealed semiconductor device according to the present invention, it is preferred that the other external terminal portions, than the part of the external terminal portions on which the semiconductor element is mounted via the insulating resin layer, are located outside, in the planar direction, relative to the internal terminal portions.

With such configuration, any given number of the external terminal portions can be provided to the substrate, as such compensating for the number of the external terminal portions that cannot be satisfied by only the external terminal portions arranged in the predetermined arrangement area in which the semiconductor element is arranged.

In the resin-sealed semiconductor device according to the present invention, it is preferred that all of the internal terminal portions connected with the semiconductor element are located inside, in the planar direction, relative to the semiconductor element.

With such configuration, an area that is occupied by the internal terminal portions on the base plate can be substantially reduced, while maintaining adequate strength for the connection with the wiring portions.

In the resin-sealed semiconductor device according to the present invention, it is preferred that each internal terminal portion has one end portion located on the one side and formed of an internal connection plated layer, while each external terminal portion has one end portion located on the other side and formed of an external connection plated layer.

With such configuration, the internal terminal face is composed of the internal connection plated layer of each internal terminal portion, while the external terminal face is composed of the external terminal connection plated layer of each external terminal portion. Therefore, an internal connection part can be readily connected with the internal terminal face of each internal terminal portion, while an external connection part can be readily connected with the external terminal face of each external terminal portion.

Preferably, in the resin-sealed semiconductor device according to the present invention, each internal terminal portion has the one end portion located on the one side and formed of the internal connection plated layer, while each external terminal portion has the one end portion located on the other side and formed of the external connection plated layer, wherein each face, on the other side, of the internal terminal portions, external terminal portions and wiring portions, is made of one kind or more of metals selected from the group consisting of Ni, Pd, Ag and Au.

With provision of the face made of such a metallic material as described above on the other side of the internal terminal portions, external terminal portions and wiring portions, the internal terminal portions, external terminal portions and wiring portions can be left intact, respectively, upon removing the base plate by etching for manufacturing the semiconductor device.

Alternatively, the method for manufacturing the substrate for the semiconductor device according to the present invention comprises the steps of:

providing a resist on a front face of a base plate made of a metal, with a desired pattern; and plating the front face of the base plate, so as to form a plurality of internal terminal portions, each having an internal terminal face at one end portion thereof opposite to the base plate, a plurality of external terminal portions, each having an external terminal face at one end portion thereof on the side of the base plate, and wiring portions connecting the internal terminal portions with the external terminal portions, wherein at least a part of the external terminal portions are formed on the base plate in a predetermined arrangement area in which a semiconductor element is arranged.

With such a manufacturing method, the part of the external terminal portions can be located on the base plate in the predetermined arrangement area in which the semiconductor element is arranged, thus enabling manufacture of the substrate for the semiconductor device significantly downsized in the planar direction.

Preferably, the method for manufacturing the substrate for the semiconductor device according to the present invention further comprises the steps of:

providing a photosensitive resist on the front and rear faces of the base plate made of the metal;

exposing the photosensitive resist provided on the front face to light with a pattern of the internal terminal portions, external terminal portions and wiring portions, while exposing the photosensitive resist provided on the rear face to light with another pattern of apertures including jig holes for mechanically positioning the base plate;

developing the photosensitive resist on both of the front and rear faces; and plating the front face of the base plate having the resist formed thereon, so as to form the internal terminal portions, external terminal portions and wiring portions, while etching the rear face so as to form the apertures including the jig holes.

Alternatively, the method for manufacturing the resin-sealed semiconductor device according to the present invention comprises the steps of:

providing a resist on a front face of a base plate made of a metal, with a desired pattern;

plating the front face of the base plate, so as to form a plurality of internal terminal portions, each having an internal terminal face at one end portion thereof opposite to the base plate, a plurality of external terminal portions, each having an external terminal face at one end portion thereof on the side of the base plate, and wiring portions connecting the internal terminal portions with the external terminal portions, mounting a semiconductor element on the end portions of at least a part of the external terminal portions on the opposite side to the base plate, via an insulating resin layer;

connecting the semiconductor element with the internal terminal faces of the internal terminal portions via internal connection parts;

sealing the internal terminal portions, external terminal portions, semiconductor element, internal connection parts and wiring portions, by using a resin sealing portion; and removing the base plate, so as to expose at least the external terminal faces of the external terminal portions to the outside.

With such a manufacturing method, the semiconductor element can be mounted on the one side of the part of the external terminal portions via the insulating resin layer, thereby to manufacture the resin-sealed semiconductor significantly downsized in the planar direction.

Preferably, the method for manufacturing the resin-sealed semiconductor device according to the present invention further comprises the steps of: providing an external insulating layer having openings respectively corresponding to the external terminal faces, on the side of the external terminal faces of the external terminal portions on the resin sealing portion; and fitting external connection parts in the openings of the external insulating layer, such that the external connection parts can be connected with the external terminal faces of the external terminal portions.

With provision of such an external insulating layer, only the external terminal portions can serve as external terminals, thus enabling manufacture of a thin-type resin-sealed semiconductor device that can avoid occurrence of unwanted phenomena, such as an inadvertent short circuit and the like. Besides, with the provision of the external insulating layer, the resin-sealed semiconductor device can be manufactured, in which the external terminal face of each external terminal portion can be electrically connected, with ease, to an external member, such as wiring of a printed-circuit board or the like, via the external connection part.

In the method for manufacturing the resin-sealed semiconductor device according to the present invention, it is preferred that the step of removing the base plate so as to expose the external terminal faces to the outside includes removal of the base plate by etching.

Such removal of the base plate by chemical dissolution in an etching step can prevent unwanted peeling of the external terminal portions from the sealing resin that may be otherwise caused by mechanical force exerted on the external terminal portions. Preferably, the material of the base plate is a metal, more preferably copper or copper alloy. As an etching solution for the etching process, any suitable ammonium-chloride-based solution can be used.

Alternatively, the substrate used for the semiconductor device related to a second aspect of the present invention comprises:

a base plate made of a metal;

a plurality of external terminal portions, each arranged in a plane on the base plate, having one end portion located on the side of the base plate and formed of an external connection plated layer having an external terminal face;

a plurality of internal terminal portions, each arranged in the plane on the base plate, having one end portion located on the opposite side to the base plate and formed of an internal connection plated layer having an internal terminal face; and wiring portions, respectively connecting the internal terminal portions with the external terminal portions in the plane on the base plate, wherein each portion of the internal terminal portions, external terminal portions and wiring portions, in contact with the base plate, is made of a metal selected from the group consisting of Ni, Pd, Ag and Au, wherein side faces of each external terminal portion, except for the external connection plated layer, extend in a normal direction relative to the base plate, while having no external connection plated layer formed thereon, wherein side faces of each internal terminal portion, except for the internal connection plated layer, extend in the normal direction relative to the base plate, while having no internal connection plated layer formed thereon, and wherein at least a part of the external terminal portions are located on the base plate in a predetermined arrangement area in which a semiconductor element is arranged.

With such configuration, the part of the external terminal portions can be located in the predetermined arrangement area in which the semiconductor element is arranged, as such the substrate for the semiconductor device can be significantly downsized in the planar direction.

In the substrate for the semiconductor device related to the second aspect of the present invention, it is preferred that the base plate is made of copper or copper alloy, while each of the external connection plated layers and the internal connection plated layers is formed by electrolytic plating.

In the substrate for the semiconductor device related to the second aspect of the present invention, it is preferred that the internal terminal portions are located on the base plate both inside and outside the predetermined arrangement area in which the semiconductor element is arranged.

In the substrate for the semiconductor device related to the second aspect of the present invention, it is preferred that the part of the external terminal portions located in the predetermined arrangement area are located inside, in the planar direction, relative to the internal terminal portions, while the other external terminal portions than the part of the external terminal portions are located outside, in the planar direction, relative to the internal terminal portions, wherein the internal terminal portions are respectively sized smaller than the external terminal portions.

According to the present invention, the substrate for the semiconductor device significantly downsized in the planar direction can be obtained, by locating the part of the external terminal portions on the base plate in the predetermined arrangement area in which the semiconductor element is arranged. Additionally, by using such a substrate for the semiconductor device, the semiconductor element can be arranged on the one side of the part of the external terminal portions via the insulating resin layer (e.g., the die attach film). Thus, the resin-sealed semiconductor device significantly downsized in the planar direction can be achieved.

DETAILED DESCRIPTION OF THE INVENTION

Examples

Hereinafter, one embodiment for a substrate used for forming a semiconductor device and a resin-sealed semiconductor device, each related to the present invention, will be described, with reference to the drawings. Of these drawings, FIG. 1 to FIGS. 5(*a*) through 5(*f*) show the embodiment of this invention, respectively.

Figure 1:
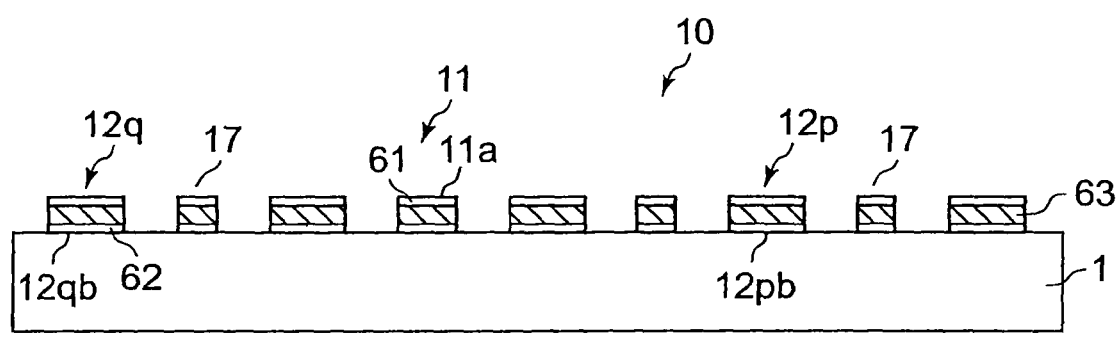
FIG. 1 is a schematic cross section showing a substrate used for a semiconductor device and related to one embodiment of the present invention.
Figure 2:
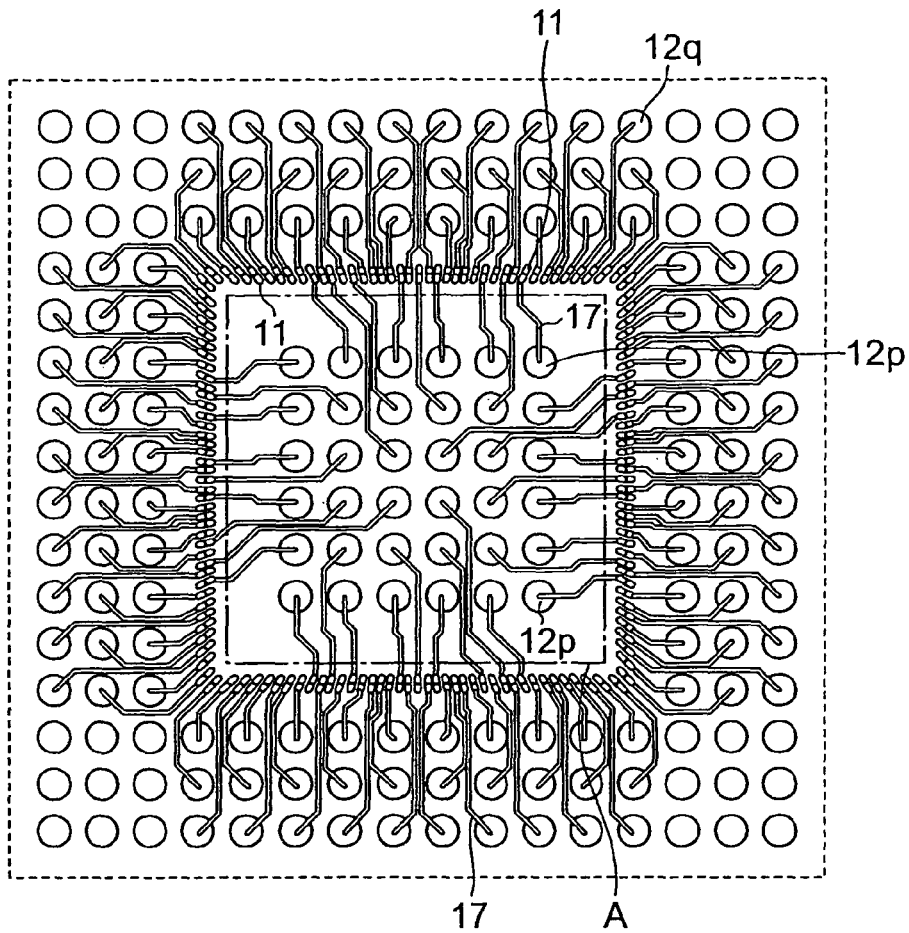
FIG. 2 includes a plan view of the substrate used for the semiconductor device and related to the embodiment of the present invention, and an enlarged plan view, in which a part of the above plan view is enlarged.
Figure 2:
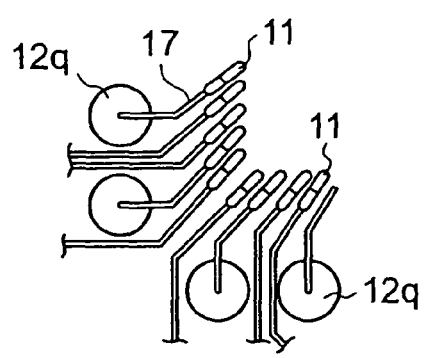
Figure 3:
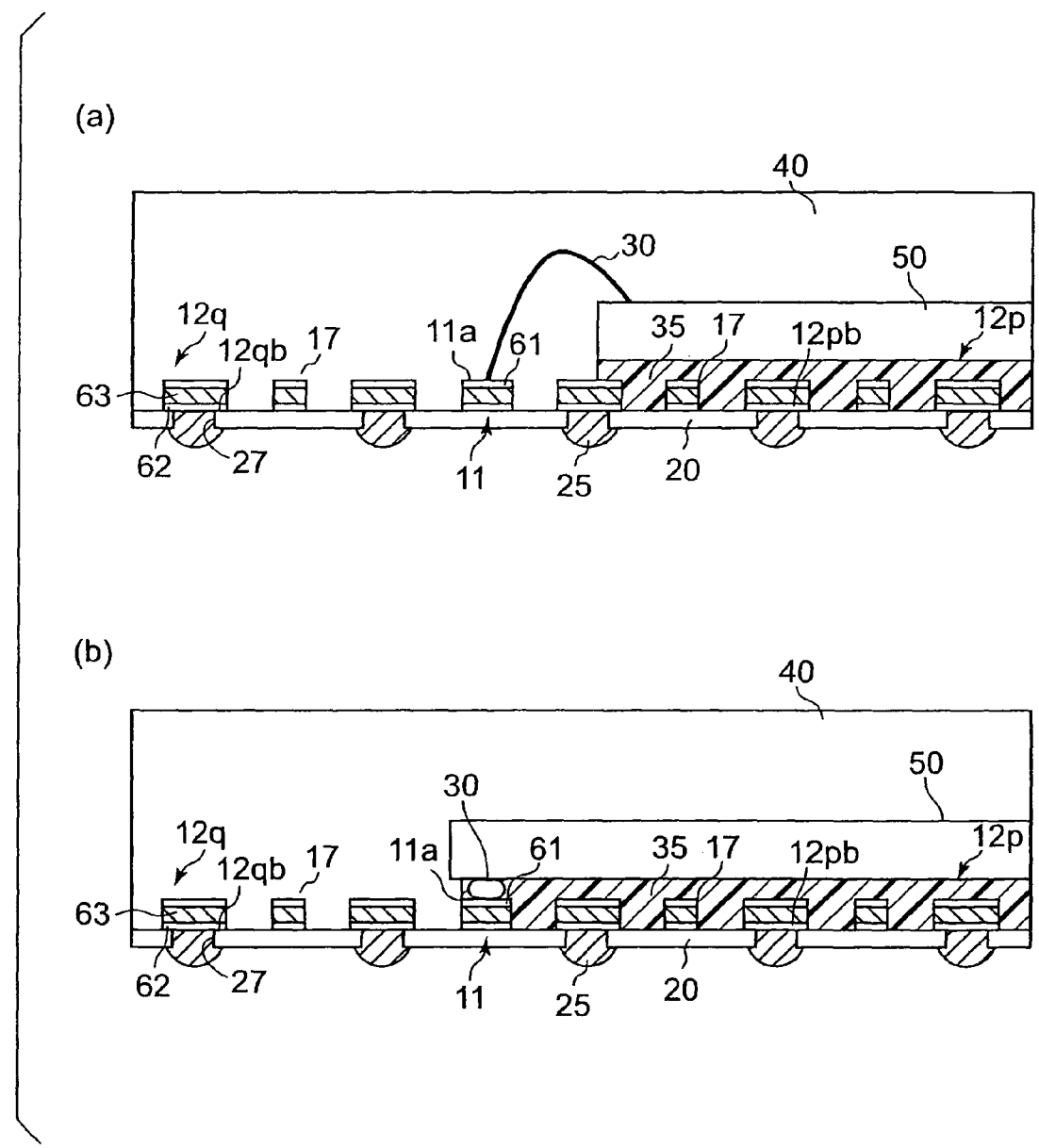
FIG. 3 is a schematic cross section showing a resin-sealed semiconductor device related to the embodiment of the present invention.
Figure 4:
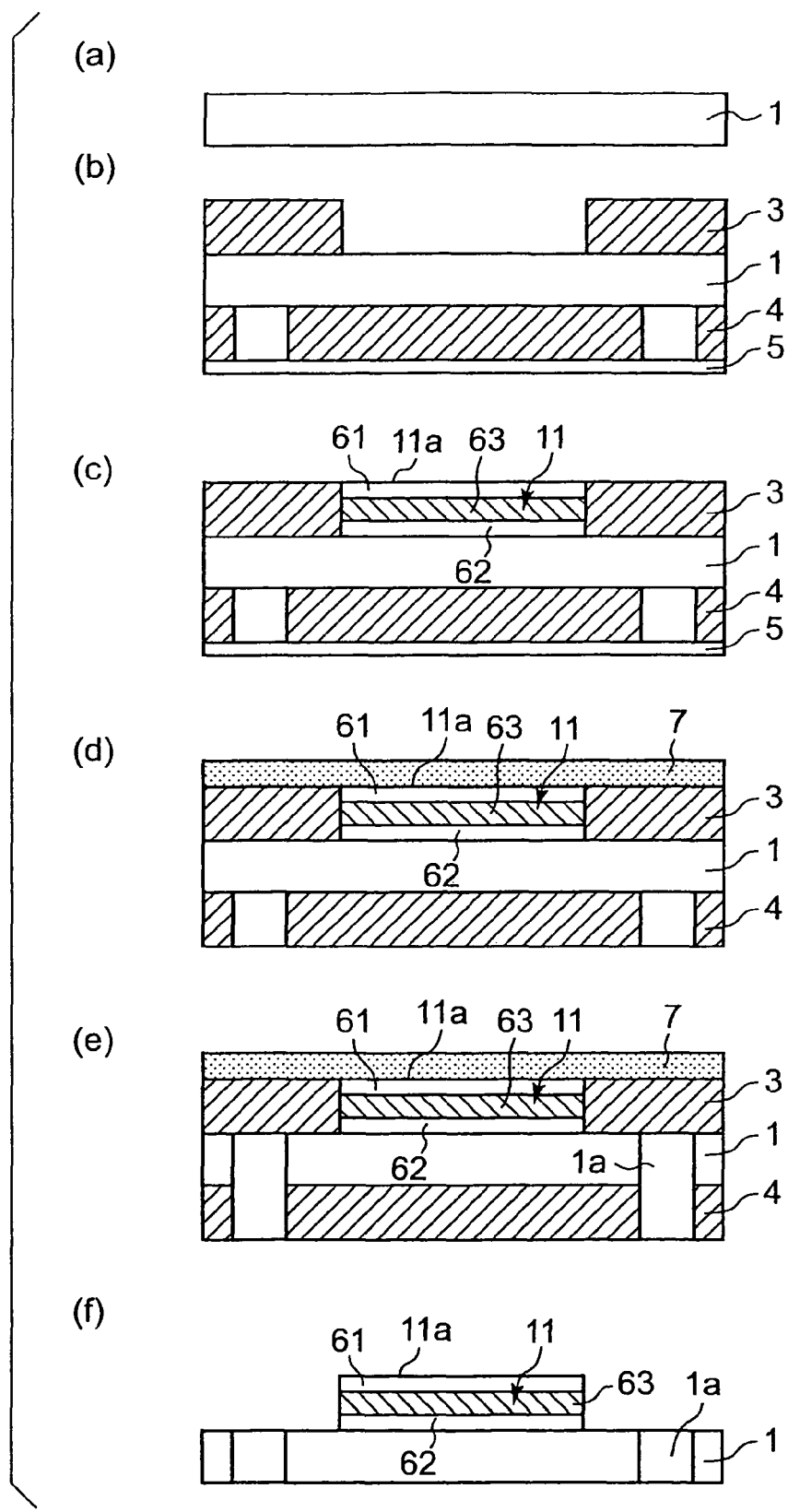
FIG. 4 is a flowchart showing a procedure for forming one internal terminal portion of the substrate used for the semiconductor device and related to the embodiment of the present invention.

As shown in FIGS. 1, 2(*a*) and 2(*b*), a substrate 10 used for forming the semiconductor device includes: a base plate 1 made of a metal; a plurality of external terminal portions 12*p*, 12*q*, respectively arranged in a plane on the base plate 1 and having external terminal faces 12*pb*, 12*qb* respectively facing the base plate 1; a plurality of internal terminal portions 11, respectively arranged in the plane on the base plate 1 and having internal terminal faces 11*a* respectively facing an opposite side to the base plate 1; and wiring portions 17, respectively connecting the internal terminal portions 11 with the external terminal portions 12*p*, 12*q* in the plane on the base plate 1. It is noted that FIG. 1 is a schematic cross section showing the substrate 10, which is used for forming the semiconductor device and is related to the embodiment of the present invention. FIG. 2(*a*) is a plan view of the substrate used for forming the semiconductor device and related to the embodiment of the present invention, and FIG. 2(*b*) is an enlarged plan view, in which a part of the above plan view is enlarged.

As shown in FIG. 2(*a*), a part of the external terminal portions 12*p* are located on the base plate 1 and arranged in a matrix form in a predetermined arrangement area A in which the semiconductor element 50 is arranged. More specifically, such external terminal portions 12*p* are arranged to form a 6×6 matrix.

As is also shown in FIG. 2(*a*), the internal terminal portions 11 are respectively located on the base plate 1 outside the predetermined arrangement area A in which the semiconductor element 50 is arranged. This arrangement of the internal terminal portions 11 corresponds to a wire-bonding mode. More specifically, the internal terminal portions 11 are arranged outside the predetermined arrangement area A, while surrounding the external terminal portions 12*p* arranged in the aforementioned 6×6 matrix form. Meanwhile, in a flip-chip mounting mode, the position of each internal terminal portion 11 is altered to be in the predetermined arrangement area A in which the semiconductor element 50 is arranged, corresponding to a position of each proper bump. However, the arrangement of the part of the external terminal portions 12*p* in the predetermined arrangement area A is not altered even in such a flip-chip mode.

Preferably, the shape of each internal terminal portion 11, when it is seen in a plan view after vertically projected onto the surface of the base plate, is substantially elliptical (see FIGS. 2(*a*), 2(*b*)) or substantially rectangular.

Referring again to FIG. 2(*a*), the other external terminal portions 12*q*, than the part of the external terminal portions 12*p* arranged in the predetermined arrangement area A, are located on the surface of the base plate 1 outside, in a planar direction, relative to the internal terminal portions 11. In this embodiment, as shown in FIG. 2(*a*), the external terminal portions 12*q* are arranged in three columns (or rows). In this case, while the external terminal portions 12*p*, 12*q* are arranged on the surface of the base plate 1, both inside and outside (i.e., in a relatively wide area), in the planar direction, relative to the internal terminal portions 11, the internal terminal portions 11 are arranged only in a space (i.e., in a relatively narrow area) surrounding the external terminal portions 12*p* arranged in the matrix form. Therefore, each internal terminal portion 11 should be sized smaller than each external terminal portion 12*p*, 12*q*.

Additionally, as shown in FIG. 2(*a*), the wiring portions 17, respectively connecting the internal portions 11 with the external portions 12*p*, 12*q*, are provided between the internal terminal portions 11 and the external terminal portions 12*p*, 12*q*.

As shown in FIGS. 2(*a*), 2(*b*), each wiring portion 17 is connected with one end portion of each elliptical or rectangular internal terminal portion 11, nearer to each corresponding external terminal portion 12*p*, 12*q*. Namely, as depicted in FIGS. 2(*a*), 2(*b*), the wiring portions 17, respectively connected with the external terminal portions 12*p* arranged in the predetermined arrangement area A, are further connected with one end portions of the internal terminal portions 11 nearer to these external terminal portions 12*p*, respectively. Meanwhile, the wiring portions 17, respectively connected with the external terminal portions 12*q* arranged outside, in the planar direction, relative to the internal terminal portions 11, are further connected with the other end portions of the internal terminal portions 11 nearer to these external terminal portions 12*q*, respectively.

Preferably, each of the internal terminal portions 11 and external terminal portions 12*p*, 12*q* has a monolayer structure of one kind of metal selected from the group consisting of Ag, Pd and Au, or otherwise has a multilayer structure of two kinds or more of metals selected from the group consisting of Cu, Ni, Ag, Pd and Au.

As shown in FIG. 1, the end portion of each internal terminal portion 11, on the opposite side (or upper side in FIG. 1) relative to the base plate 1, is preferably composed of an internal connection plated layer 61 for facilitating connection with the wire or bump (or internal connection part) 30 which will be described later. Preferably, each internal connection plated layer 61 has a monolayer structure or multilayer structure of two kinds or more of metals selected from the group consisting of Au, Pd, Ag and the like. More preferably, the thickness of the plated layer 61 is within a range of from 0.01 to 5 μm.

Meanwhile, the end portion of each external terminal portion 12*p*, 12*q*, on the side of the base plate 1 (or lower side in FIG. 1), is preferably composed of an external connection plated layer 62 for facilitating connection with a solder ball (or external connection part) 25 which will be described later. Preferably, each external connection plated layer 62 has a monolayer structure or multilayer structure of two kinds or more of metals selected from the group consisting of Ni, Pd, Ag, Au and the like. More preferably, the thickness of the plated layer 62 is within a range of from 0.01 to 5 μm.

In this embodiment, for facilitating the manufacture, each of the internal terminal portions 11, external terminal portions 12*p*, 12*q* and wiring portions 17 has the same layered structure as shown in FIG. 1. Specifically, each of the internal terminal portions 11, external terminal portions 12*p*, 12*q* and wiring portions 17 has the internal connection plated layer 61 provided to one end portion thereof on the opposite side (or upper side) relative to the base plate 1 and external connection plated layer 62 provided to the other end portion thereof on the side of the base plate 1 (or lower side), and an intermediate layer 63 provided between the internal connection plated layer 61 and the external connection plated layer 62. Each side face of a portion of each external terminal portion 12*p*, 12*q*, except for the internal connection plated layer 61 and external connection plated layer 62, (i.e., each side face of the intermediate layer 63 in this embodiment), extends in a normal direction (or vertical direction) to the base plate 1, while having no external connection plated layer 62 formed thereon. Similarly, each side face of a portion of each internal terminal portion 11, except for the internal connection plated layer 61 and external connection plated layer 62, (i.e., each side face of the intermediate layer 63 in this embodiment), extends in a normal direction (or vertical direction) to the base plate 1, while having no internal connection plated layer 61 formed thereon.

It should be appreciated that the construction of the internal terminal portions 11, external terminal portions 12*p*, 12*q* and wiring portions 17 is not limited to such an aspect as described above. For instance, only the end portions, on the side of the base plate 1 (or lower side), of the internal terminal portions 11 and external terminal portions 12*p*, 12*q* may have the external connection plated layers 62 formed thereon, respectively. Otherwise, only the end portions, on the opposite side (or upper side) relative to the base plate 1, of the internal terminal portions 11 and external terminal portions 12*p*, 12*q* may have the internal connection plated layers 61 formed thereon, respectively. Furthermore, by using a suitable mask upon a plating process by electrolytic plating, the internal connection plated layers 61 may be provided to the end portions, on the opposite side (or upper side) relative to the base plate 1, of the internal terminal portions 11, while the external connection plated layer 62 may be provided to the end portions, on the side of the base plate 1 (or lower side), of the external terminal portions 12*p*, 12*q*, respectively. It should be appreciated that the total amount of the precious metal (or metals) used for forming the internal connection plated layers and external connection plated layers can be substantially reduced, by using such a suitable mask for providing partial plating to the respective end portions. In this invention, however, the base plate 1 is removed by etching, as will be described later. Therefore, each portion, on the side of the base plate 1, of the internal terminal portions 11, external terminal portions 12*p*, 12*q* and wiring portions 17, should be made of a metal, such as Ni, Pd, Ag or Au, having adequate resistance to an etching solution for the base plate 1.

Figure 6:
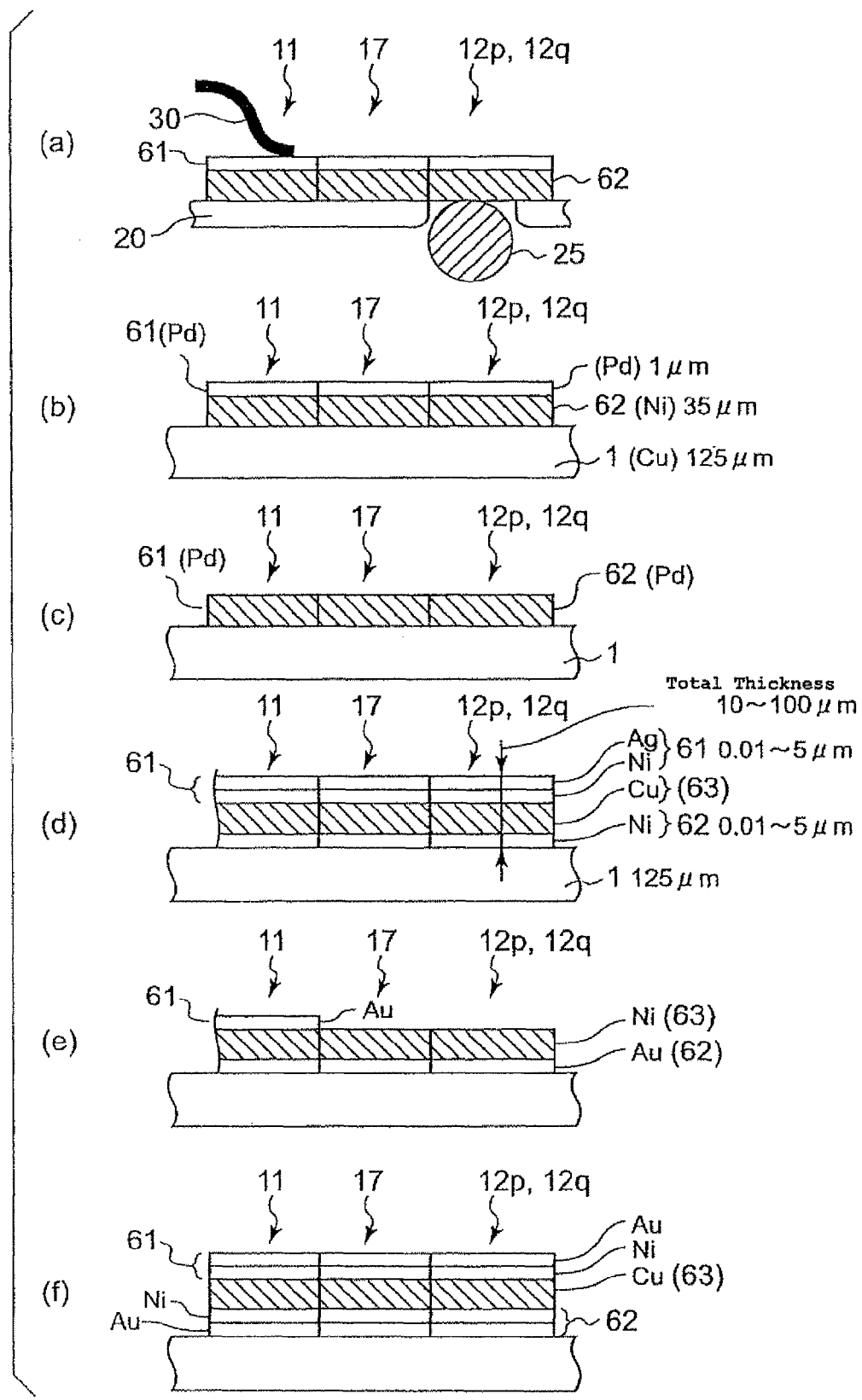
FIG. 6 shows several cross sections for respectively illustrating exemplary layered structures, each including the internal terminal portion, external terminal portion and wiring portion.
Figure 7:
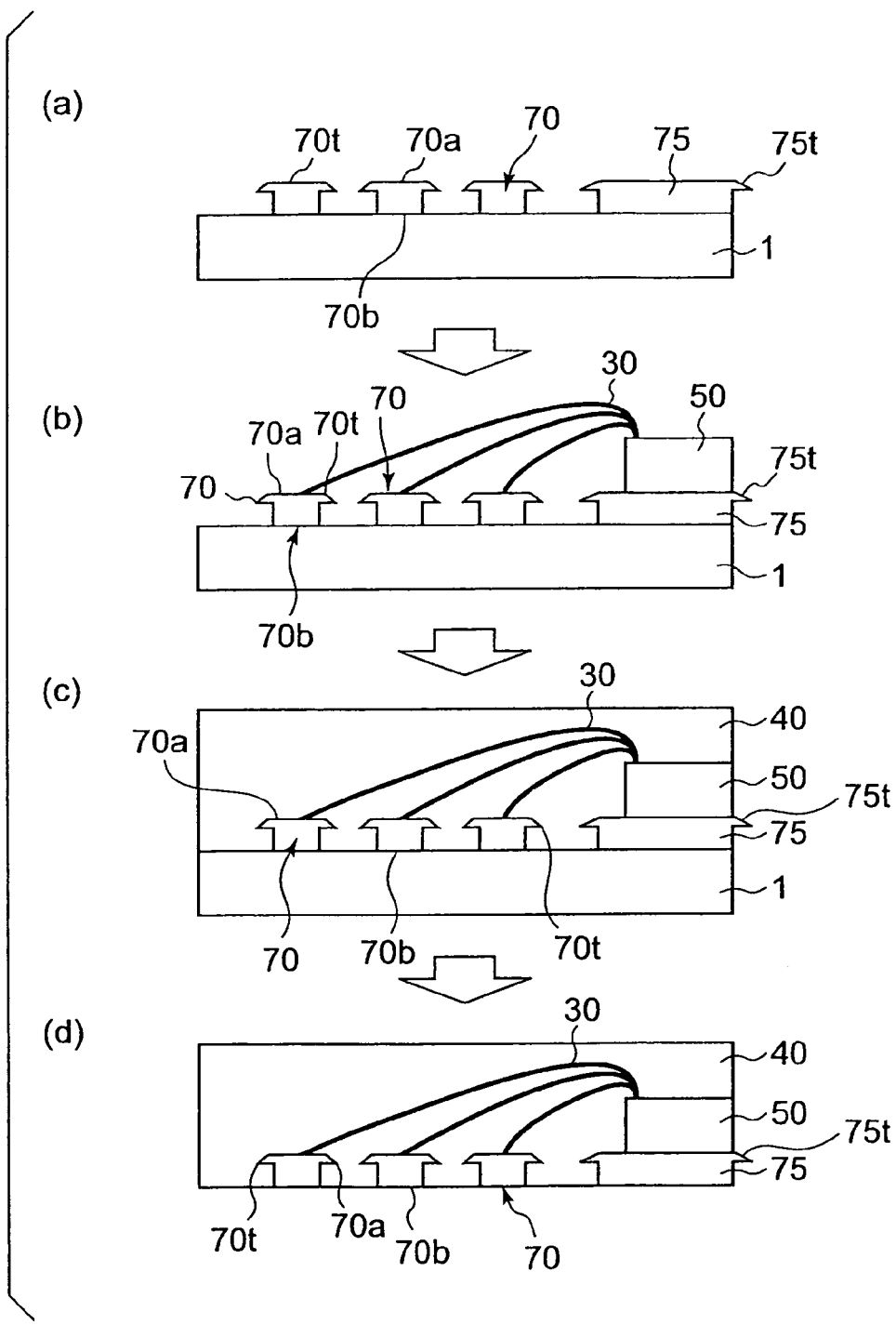
FIG. 7 is a flowchart showing a procedure for manufacturing a conventional resin-sealed semiconductor device.

FIG. 6 shows several cross sections for respectively illustrating exemplary layered structures, each including the internal terminal portion 11, external terminal portion 12*p*, 12*q* and wiring portion 17. In this drawing, FIG. 6(*a*) shows a state, in which the internal connection part 30 is attached to the internal terminal portion 11, while the external connection part 25 is attached to the external terminal portion 12*p* or 12*q*. FIG. 6(*b*) shows one example in which the internal terminal portion 11 and external terminal portion 12*p* or 12*q* are respectively composed of two plated layers of Ni/Pd, formed, in this order, on the base plate 1. FIG. 6(*c*) shows one example in which both of the internal terminal portion 11 and external terminal portion 12*p* or 12*q* are composed of a single plated layer of Pd. FIG. 6(*d*) shows one example in which both of the internal terminal portion 11 and external terminal portion 12p or 12q are composed of four plated layers of Ni/Cu/Ni/Ag, formed, in this order, on the base plate 1, wherein the external connection plated layer 62 is made of Ni, the internal connection plated layer 61 is made of Ni/Ag, and the intermediate layer 63 is made of Cu. FIG. 6(e) shows a layered structure of Au/Ni/Au, formed, in this order, on the base plate 1, wherein the external connection plated layer 62 is made of Au and the internal connection plated layer 61 is also made of Au, while the intermediate layer 63 is made of Ni. FIG. 6(f) shows a five-layer structure of Au/Ni/Cu/Ni/Au, formed, in this order, on the base plate 1, wherein the external connection plated layer 62 is made of Au/Ni, the internal connection plated layer 61 is made of Ni/Au, and the intermediate layer 63 is made of Cu. The total thickness of the above plated layers is preferably within a range of from 5 to 100 μm. If the thickness is less than 5 μm, it would be difficult to obtain adequate mechanical strength of the internal terminal portion 11. Preferably, the thickness of each terminal portion is 10 μm or more. However, if the thickness is greater than 100 μm, it would take too much time to form each terminal portion by plating, thus degrading cost performance.

Especially, it is preferred that each of the internal terminal portions 11 and external terminal portions 12p, 12q has a layered structure of Ni/Pd, Ni/Au, Ni/Au/Ag, Ni/Pd/Au, Ni/Cu/Ni/Au, Ni/Cu/Ni/Ag, Ni/Cu/Ni/Pd/Au, Au/Ni/Au, Au/Ni/Ag, Au/Ni/Pd/Au, Au/Ni/Cu/Ni/Au, Au/Ni/Cu/Ni/Ag, Au/Ni/Cu/Ni/Pd/Au, Au/Pd/Ni/Au, Au/Pd/Ni/Ag, Au/Pd/Ni/Pd/Au, Au/Pd/Ni/Cu/Ni/Au, Au/Pd/Ni/Cu/Ni/Ag or Au/Pd/Ni/Cu/Ni/Pd/Au, respectively formed, in this order, on the base plate 1.

It is noted that apertures 1a used for positioning and/or carrying the base plate 1 are provided in the base plate 1 (see FIGS. 4(e) and 4(f)). Such apertures 1a can also serve to mitigate unwanted deformation of the base plate 1 that may be otherwise caused by thermal expansion. However, for simplification, the apertures 1a are not shown in FIGS. 1, 2(a) and 2(b).

As shown in FIG. 3(a), the resin-sealed semiconductor device manufactured by using the aforementioned base plate 1 includes the plurality of internal terminal portions 11, respectively arranged in the plane and having the internal terminal faces 11a respectively facing upward (or one side), the plurality of external terminal portions 12p, 12q, respectively arranged in the plane and having the external terminal faces 12pb, 12qb respectively facing downward (or the other side), and the wiring portions 17, respectively connecting the internal terminal portions 11 with external terminal portions 12p, 12q.

As is also shown in FIG. 3(a), the semiconductor element 50 is mounted on the part of the external terminal portions 12p (in this embodiment, 36 (i.e., 6×6) external terminal portions 12p (see FIG. 2(a)), via an electrically insulating adhesive layer (e.g., a die attach film) 35. The semiconductor element 50 is electrically connected with the internal terminal face 11a of each internal terminal portion 11, via the internal connection part 30 (the wire shown in FIG. 3(a) or bump shown in FIG. 3(b), wherein the bump is used in the flip-chip mounting mode).

Referring again to FIG. 3(a), all of the internal terminal portions 11, external terminal portions 12p, 12q, semiconductor element 50, wires (or internal connection parts) 30 and wiring portions 17 are sealed with a sealing portion 40 made of a resin material. As the resin material, any suitable sealing resin, which is usually used for the conventional resin-sealed semiconductor device and exhibits electrically insulating properties, can be employed. Thus, the resin material is not limited to a particular one.

As is also shown in FIG. 3(a), a solder resist (or external insulating layer) 20 having openings 27, respectively corresponding to the external terminal faces 12pb, 12qb, is provided on the side of the external terminal faces 12pb, 12qb of the external terminal portions 12p, 12q on the resin sealing portion 40. In each opening 27 of the solder resist 20, the solder ball (external connection part) 25 is inserted or fitted to be connected with the external terminal face 12pb or 12qb of each external terminal portion 12p, 12q.

Next, operation of this embodiment constructed as described above will be discussed.

Method for Manufacturing the Substrate Used for the Semiconductor Device

First, a method for manufacturing the substrate 10 used for the semiconductor device will be described, with reference to FIGS. 4(a) to 4(e). In this method, the substrate 10 includes the internal terminal portions 11, external terminal portions 12p, 12q and wiring portions 17, all of which have the same layered structure. In addition, each of the internal terminal portions 11 and external terminal portions 12p, 12q has the external connection plated layer 62 formed on one end portion thereof on the side of the base plate 1 (or lower side), while having the internal connection plated layer 61 formed on the other end portion thereof on the opposite side (or upper side) relative to the base plate 1.

For simplification, a procedure for forming a single internal terminal portion 11 is shown, by way of example, in FIGS. 4(a) through 4(e). However, it should be appreciated that each of the external terminal portions 12p, 12q and wiring portions 17 can also be formed in a similar manner.

First, the base plate 1 is prepared (see FIG. 4(a)). Preferably, the base plate 1 is electrically conductive, because each of the terminal portions 11, 12p, 12q is formed thereon by electrolytic plating. More preferably, the base plate 1 is made of copper or copper alloy, because it is removed by etching after completion of a package. Thereafter, oil and other like dirt attached to the surface of the base plate 1 is removed (i.e., removal of grease is carried out).

Then, a plating resist 3 and an etching resist 4 are respectively provided to the front and rear faces of the base plate 1, with each desired pattern. Specifically, a photosensitive resist layer, e.g., a dry-film resist, is attached to both of the front and rear faces of the base plate 1 (see FIG. 4(b)). Thereafter, the dry film resists (DFR) 3, 4 are exposed to light with each desired pattern, then developed, respectively. If the front and rear faces are exposed to light in the same step, the relative positional accuracy, between the pattern (i.e., the external terminal portions 12p, 12q, internal terminal portions 11 and wiring portions 17) formed on the base plate 1 by plating and the pattern of apertures including jig holes for the base plate 1 and formed by etching, can be kept in a highly desirable condition. It is noted that the apertures formed by etching may include not only the aforementioned jig holes but also any suitable slits used for cutting a multiple pattern.

Subsequently, the dry film resist 4 provided to the rear face of the base plate 1 is covered with a protective film 5 (see FIG. 4(b)).

Thereafter, the plurality of external terminal portions 12p, 12q respectively having the external terminal faces 12pb, 12b on the end portions thereof on the side of the base plate 1, plurality of internal terminal portions 11 respectively having the internal terminal faces 11a on the end portions thereof on the opposite side to the base plate 1 and wiring portions 17 respectively connecting the internal terminal portions 11 with external terminal portions 12p, 12q are formed, respectively, by electrolytic plating, in the plane, on the front face of the base plate 1 (see FIGS. 1, 2(a), 2(b) and 4(c)).

In this case, the external connection plated layers 62 are formed on the respective end portions on the lower side (or on the side of the base plate 1) of the internal terminal portions 11, external terminal portions 12p, 12q and wiring portions 17, the internal connection plated layers 61 are formed on the respective end portions on the upper side (or on the opposite side to the base plate 1) thereof (see FIGS. 1 and 4(c)), and the intermediate layers 63 are formed between the external connection plated layers 62 and the internal connection plated layers 61, respectively. Consequently, each internal connection plated layer 61 formed on the end portion on the upper side of each internal terminal portion 11 constitutes the internal terminal face 11a of the internal terminal portion 11. Meanwhile, each external connection plated layer 62 formed on the end portion on the lower side of each external terminal portion 12p, 12q constitutes the external terminal face 12pb or 12qb of the external terminal portion 12p or 12q.

In this embodiment, the electrolytic plating is employed after the plating resist 3 is provided on the base plate 1 with the desired pattern. Therefore, each side face of the internal terminal portions 11 and external terminal portions 12p, 12q can be formed to extend along each corresponding side face of the pattern of the plating resist 3. In other words, each of the internal terminal portions 11 and external terminal portions 12p, 12q can be formed to have side faces each extending in the normal direction (or vertical direction) relative to the base plate 1. This plating method can also prevent the external connection plated layers 62 and internal connection plated layers 61 from being formed on any side faces of the respective intermediate layers 63. More specifically, in this embodiment, the internal connection plated layers 61 are formed after the formation of the intermediate layers 63. However, each side face of the intermediate layers 63 extends in the normal direction relative to the base plate 1 (i.e., the side face is in contact with one side face of the corresponding plating resist 3). Therefore, the formation of the internal connection plated layer 61 on any side faces of each intermediate layer 63 can be prevented. Thus, the formation of the external connection plated layers 62 and/or internal connection plated layers 61 on unneeded or unwanted portions can be securely prevented, thereby reducing the production cost.

As shown in FIG. 2(a), the part of the external terminal portions 12p are located on the base plate 1 and arranged in the matrix form in the predetermined arrangement area A in which the semiconductor element 50 is arranged. With such arrangement of the external terminal portions 12p in the predetermined arrangement area A in which the semiconductor element 50 is arranged, a space that could not be utilized in the prior art can be used in this embodiment. Therefore, the substrate 10 used for the semiconductor device can be significantly downsized in the planar direction (or any suitable direction vertical to the thickness direction of the substrate).

Again, as shown in FIG. 2(a), the internal terminal portions 11 are arranged on the base plate 1 around the predetermined arrangement area A in which the semiconductor element 50 is arranged. With such arrangement of the internal portions 11 around the predetermined arrangement area A, the internal terminal portions 11 are not overlapped with the semiconductor element 50 arranged in the predetermined arrangement area A. Therefore, this arrangement is suitable for connecting each internal terminal portion 11 with the semiconductor element 50 via the wire. Thus, the internal terminal portions 11 can be securely connected with the semiconductor element 50 as will be described later. Meanwhile, in the case in which the internal terminal portions 11 are arranged in the predetermined arrangement area A, as shown in FIG. 3(b), the internal terminal portions 11 are directly overlapped with the bumps (or internal connection parts) 30 provided on the surface of the semiconductor element, respectively. Accordingly, such arrangement enables connection via the bumps and is thus suitable for the flip-chip mounting mode. However, the arrangement of the internal terminal portions 11 is not limited to such aspects. For instance, the internal terminal portions 11 may be located on the base plate 1, while being arranged both inside and outside the predetermined arrangement area A.

Further, as shown in FIG. 2(a), the other external terminal portions 12q, than the part of the external terminal portions 12p arranged in the predetermined arrangement area A, are located on the base plate 1 outside, in the planar direction, relative to the internal terminal portions 11. Such a manner of providing the external terminal portions 12q outside, in the planar direction, relative to the internal terminal portions 11 enables any given number of external terminal portions 12q to be arranged on the substrate. Thus, such arrangement can compensate for the number of the external terminal portions that cannot be satisfied by only the external terminal portions 12p arranged in the predetermined arrangement area A in which the semiconductor element 50 is arranged.

As shown in FIGS. 2(a), 2(b), each internal terminal portion 11, when seen in a plan view after vertically projected onto the surface of the base plate, is of a substantially elliptical shape extending along each corresponding wiring portion 17. Therefore, such a shape can significantly reduce the area occupied by each internal terminal portion 11 on the base plate 1, while adequately keeping strength or reliability of connection with each corresponding wiring portion 17.

Thereafter, the protective film 5 covering the dry film resist 4 on the rear face side of the base plate 1 is peeled off. Then, the dry film resist 3 provided on the front face side of the base plate 1, internal terminal portions 11 and external terminal portions 12p, 12q, and wiring portions 17 are all covered with a protective film 7 (see FIG. 4(d)).

Subsequently, the base plate 1 is etched on its rear face side, so as to form the holes 1a (e.g., the jig holes and/or slits used for cutting) in predetermined positions of the base plate 1 (see FIG. 4(e)). Namely, such holes 1a are used for positioning and/or carrying the base plate 1.

Thereafter, the protective film 7 provided on the front face side of the base plate 1 is peeled off. Then, the dry film resists 3, 4 respectively provided on the front and rear face sides of the base plate 1 are removed (see FIG. 4(f)).

Method for Manufacturing the Resin-Sealed Semiconductor Device

Next, a method for manufacturing the resin-sealed semiconductor device, by using the substrate 10 used for the semiconductor device and prepared as described above, will be discussed, with reference to FIGS. 5(a) to 5(f).

First, the substrate 10 used for the semiconductor device is prepared as described above (see FIGS. 2(a) and 5(a)).

Then, the semiconductor element 50 is mounted on the upper side (or one side) of the part (i.e., 36 (6×6)) of the external terminal portions 12p (see FIG. 2(a)) arranged in the predetermined arrangement area A, via the die attach film 35 (see FIG. 5(b)). In other words, such configuration enables the external terminal portions 12p to be arranged in the space on the lower side (or the other side) of the semiconductor element 50 that could not be utilized in the prior art.

Subsequently, the semiconductor element 50 is connected with the respective internal terminal faces 11a of the internal terminal portions 11, via the wires (internal connection parts) 30 (see FIG. 5(b)). Since each internal terminal face 11a of the internal terminal portions 11 is formed of the internal connection plated layer 61, the wire 30 can be readily connected with the internal terminal face 11*a*. Further, since each internal terminal portion 11 is fixed in position to the base plate 1 in a state as shown in FIG. 5(*b*), such an internal terminal portion 11 is less likely to be deformed or broken, even when applied with mechanically strong power generated upon the wire bonding.

Figure 5:
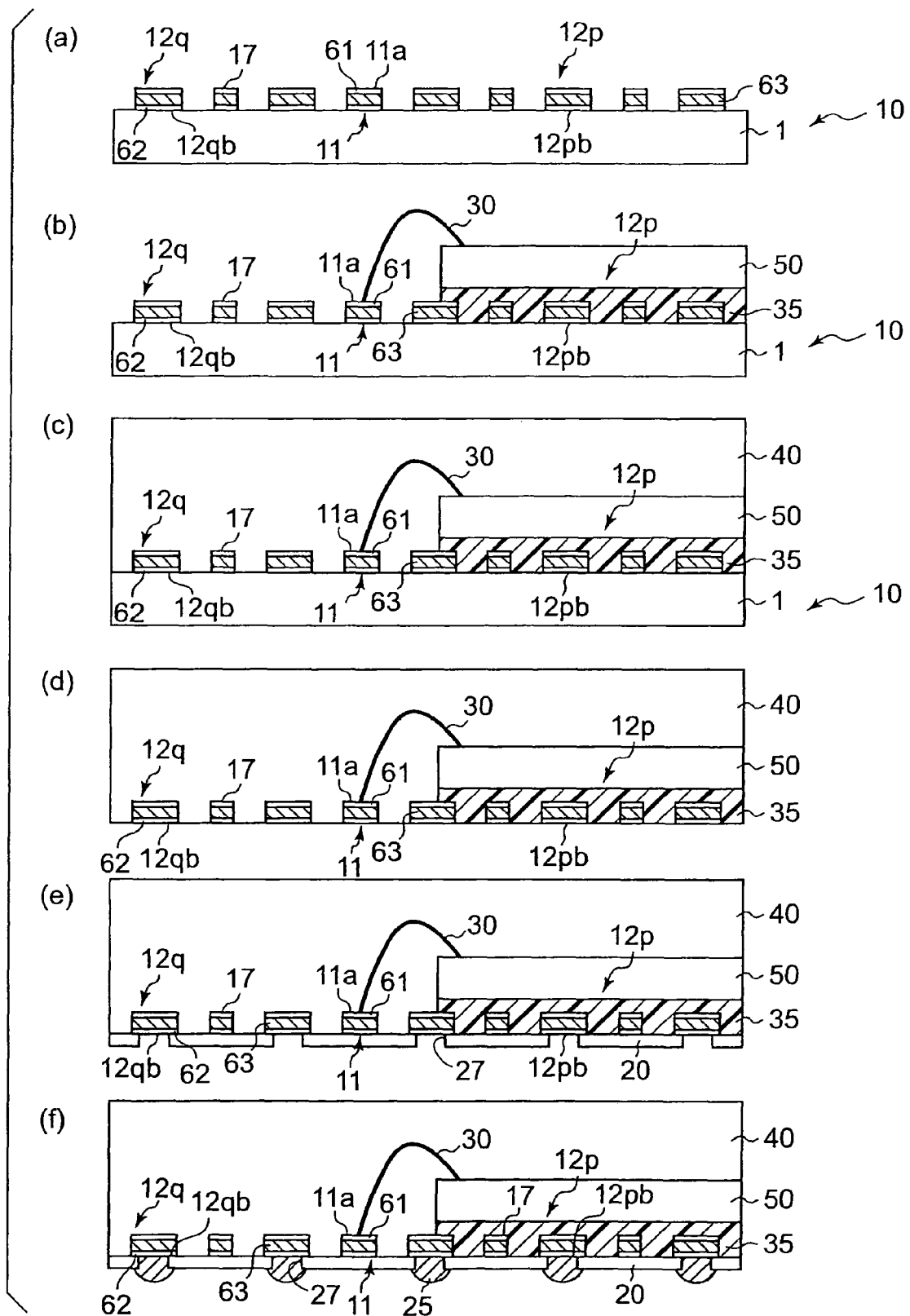
FIG. 5 is a flowchart showing a procedure for manufacturing the resin-sealed semiconductor device related to the embodiment of the present invention.

Thereafter, the internal terminal portions 11, external terminal portions 12*p*, 12*q*, semiconductor element 50, wires 30 and wiring portions 17 are all sealed with the resin sealing portion 40 made of the resin material (see FIG. 5(*c*)).

Then, the base plate 1 is removed by etching (see FIG. 5(*d*)). In this manner, once the base plate 1 is removed, the external terminal faces 12*pb*, 12*pq* of the external terminal portions 12*p*, 12*q* are exposed to the outside, respectively. If the base plate 1 is made of copper or copper alloy, such a base plate 1 can be removed, by using an ammonia-based etching liquid, while the internal terminal portions 11, external terminal portions 12*p*, 12*q* and wiring portions 17, each having a surface metal layer made of Ni, Pd, Ag, Au or the like, are respectively left intact in the resin sealing portion 40. One advantageous point in removing the base plate 1 by etching is to eliminate necessity of mechanical peeling for the removal of the base plate 1, thus avoiding the risk of undesired peeling of the internal terminal portions 11, external terminal portions 12*p*, 12*q* and wiring portions 17 from the resin sealing portion 40. As the ammonia-based etching liquid, any suitable etching liquid, containing ammonium chloride as a main component, can be used.

Thereafter, an electrically insulating resin layer, e.g., the solder resist 20 having the openings 27 formed in only positions respectively corresponding to the external terminal faces 12*pb*, 12*qb*, is provided on the side of the external terminal faces 12*pb*, 12*qb* of the external terminal portions 12*p*, 12*q* on the resin sealing portion 40 (see FIG. 5(*e*)).

With the provision of such a solder resist 20, only desired sites (i.e., only the external terminal portions 12*p*, 12*q*) can serve as external terminals, while the lower face of each internal terminal portion 11 as well as the lower face of each wiring portion 17 can be electrically insulated or protected by the insulating layer (or solder resist) 20. Consequently, unwanted phenomena, such as an inadvertent short circuit and the like, can be avoided. As the insulating layer, any suitable solder resist having proper photosensitivity can be used. By using such a photosensitive resist material, the openings respectively corresponding to the external terminal portions 12*p*, 12*q* can be readily formed.

Additionally, the solder resist 20 can serve to support a part of each external terminal portion 12*p*, 12*q* as well as support the internal terminal portions 11 and wiring portions 17. Accordingly, such supported parts and portions can be physically protected, in a stable state, in the resin sealing portion 40.

Then, the solder ball (external connection part) 25 is inserted or fitted in each opening 27 of the solder resist 20, such that the solder ball 25 can be in connection with the external terminal face 12*pb* or 12*qb* of each external terminal portion 12*p*, 12*q* (see FIG. 5(*f*)). Since the external terminal face 12*pb* or 12*qb* of each external terminal portion 12*p*, 12*q* is formed of the connection plated layer 62, each solder ball 25 can be readily connected with the external terminal face 12*pb* or 12*qb*.

With the provision of such a downwardly projected solder ball 25, the external terminal face 12*pb* or 12*qb* of each external terminal portion 12*p*, 12*q* can be electrically connected, with ease, to an external member (not shown), such as wiring of a printed-circuit board, via the solder ball 25.

In place of fitting the solder balls 25 in the respective openings 27, plated layers, each having a thickness enough to be projected outward from the openings 27, may be respectively formed on the external terminal faces 12*pb*, 12*qb* of the external terminal portions 12*p*, 12*q*, by electroless plating.

According to the resin-sealed semiconductor device manufactured as described above, the external terminal portions 12*p*, 12*q* respectively having the external terminal faces 12*pb*, 12*qb* can be provided, even under the semiconductor element 50, thereby achieving the so-called Fan-In type configuration. In other words, such configuration enables the external terminal portions 12*p*, 12*q* to be arranged in the space on the lower side (or on the other side) of the semiconductor element 50 that could not be utilized in the prior art. Thus, the resin-sealed semiconductor device can be significantly downsized in the planar direction (or any suitable direction vertical to the thickness direction of the device).

Generally, a conventional lead frame used in the semiconductor device has been formed by etching and required an approximately 100 to 250 μm thickness for the mechanical strength. However, in a structure in which each lead is formed, by plating, on the base plate 1 according to the present invention, the lead can be thinned up to 5 to 100 μm, thereby significantly reducing the entire thickness of the semiconductor device (or semiconductor package).

The invention claimed is:

1. A method for manufacturing a substrate for a semiconductor device, the method comprising the steps of:
providing a resist on a front face of a base plate made of a metal, with a desired pattern; and
plating the front face of the base plate, so as to form a plurality of internal terminal portions, each having an internal terminal face at one end portion thereof opposite to the base plate, a plurality of external terminal portions, each having an external terminal face at one end portion thereof on the side of the base plate, and wiring portions connecting the internal terminal portions with the external terminal portions,
wherein at least a part of the external terminal portions are formed on the base plate in a predetermined arrangement area in which a semiconductor element is arranged.

2. The method for manufacturing the substrate for the semiconductor device according to claim 1, further comprising the steps of:
providing a photosensitive resist on the front and rear faces of the base plate made of the metal;
exposing the photosensitive resist provided on the front face to light with a pattern of the internal terminal portions, external terminal portions and wiring portions, while exposing the photosensitive resist provided on the rear face to light with another pattern of apertures including jig holes for mechanically positioning the base plate;
developing the photosensitive resist on both of the front and rear faces; and
plating the front face of the base plate having the resist formed thereon, so as to form the internal terminal portions, external terminal portions and wiring portions, while etching the rear face so as to form the apertures including the jig holes.

3. A method for manufacturing a resin-sealed semiconductor device, the method comprising the steps of:
providing a resist on a front face of a base plate made of a metal, with a desired pattern;

plating the front face of the base plate, so as to form a plurality of internal terminal portions, each having an internal terminal face at one end portion thereof opposite to the base plate, a plurality of external terminal portions, each having an external terminal face at one end portion thereof on the side of the base plate, and wiring portions connecting the internal terminal portions with the external terminal portions, mounting a semiconductor element on the end portions of at least a part of the external terminal portions on the opposite side to the base plate, via an insulating resin layer;

electrically connecting the semiconductor element with the internal terminal faces of the internal terminal portions via internal connection parts;

sealing the internal terminal portions, external terminal portions, semiconductor element, internal connection parts and wiring portions, by using a resin sealing portion; and removing the base plate, so as to expose at least the external terminal faces of the external terminal portions to the outside.

4. The method for manufacturing the resin-sealed semiconductor device according to claim 3, further comprising the steps of:

providing an insulating layer having openings respectively corresponding to the external terminal faces, on the side of the external terminal faces of the external terminal portions on the resin sealing portion; and fitting external connection parts in the openings of the insulating layer, such that the external connection parts can be connected with the external terminal faces of the external terminal portions.

5. The method for manufacturing the resin-sealed semiconductor device according to claim 3, wherein the step of removing the base plate so as to expose the external terminal faces to the outside includes removal of the base plate by etching.

* * * * *